US007864189B2

(12) United States Patent
Vaughn

(10) Patent No.: US 7,864,189 B2
(45) Date of Patent: Jan. 4, 2011

(54) CONVERTING COLOR DATA TO A COLOR PALETTE

(75) Inventor: Robert Vaughn, Albuquerque, NM (US)

(73) Assignee: Intel Corporation, Santa Clara, CA (US)

( * ) Notice: Subject to any disclaimer, the term of this patent is extended or adjusted under 35 U.S.C. 154(b) by 774 days.

(21) Appl. No.: 11/880,558

(22) Filed: Jul. 23, 2007

(65) Prior Publication Data

US 2009/0027414 A1 Jan. 29, 2009

(51) Int. Cl.

| | |
|---|---|
| ***G09G 5/02*** | (2006.01) |
| ***G09G 5/00*** | (2006.01) |
| ***H04N 7/04*** | (2006.01) |
| ***H04N 1/46*** | (2006.01) |
| ***G03F 3/08*** | (2006.01) |
| ***G06K 9/00*** | (2006.01) |
| ***G06K 9/40*** | (2006.01) |
| *H04N 5/46* | (2006.01) |
| *G06K 9/32* | (2006.01) |
| *G06F 7/00* | (2006.01) |

(52) U.S. Cl. ....................... 345/589; 345/586; 345/591; 345/600; 345/606; 348/496; 348/557; 358/518; 358/523; 358/525; 382/162; 382/254; 382/274; 382/300; 707/705; 707/769; 707/770

(58) Field of Classification Search ................. 345/426, 345/428, 581, 589, 586, 591, 600–601, 606, 345/618, 549, 555; 348/251–254, 263, 269, 348/496, 517, 538–539, 557, 671; 358/518–519, 358/523, 525; 382/162–167, 254, 274, 276, 382/300

See application file for complete search history.

(56) References Cited

U.S. PATENT DOCUMENTS

| | | | | |
|---|---|---|---|---|
| 5,911,003 | A * | 6/1999 | Sones | 382/162 |
| 2005/0123211 | A1 * | 6/2005 | Wong et al. | 382/254 |
| 2010/0026705 | A1 * | 2/2010 | Im et al. | 345/590 |

OTHER PUBLICATIONS

Image Magick, list of command-line tools for "colorspace value", pp. 1-2, http://www.imagemagick.org/script/command-line-options.php#colorspace.

Google Groups, wavelength and intensity discussion, p. 1, http://groups.google.com.sv/group/rec.photo.misc/msg/51d9db60f6c4859f.

Wikipedia, HSL color space definition, pp. 1-5, http://en.wikipedia.org/wiki/HSL_color_space.

Compiled by Paul Bourke, "Converting Between RGB and CMY, YIQ, YUV," Feb. 1994, pp. 1-7.

Paul Bourke, "HSV Colour Space, Hue-Saturation-Value," Jun. 2000, pp. 1-9.

Brian Smits, "An RGB to Spectrum Conversion for Reflectances," Jan. 21, 2000, pp. 1-10.

Rhodonine™ and Activa™, "Processes in Biological Vision," Jul. 3, 2002, pp. 1-19.

Microsoft Corporation, "WCS Color Device Model Profile Schema and Algorithms," 2007, 1-28.

Wikipedia, Visible spectrum, pp. 1-3, http://en.wikipedia.org/wiki/Visible_light.

Phillip Laven, "Source of Error, Wavelength and Color," p. 1, http://www.philiplaven.com/p19.html.

* cited by examiner

*Primary Examiner*—Wesner Sajous
(74) *Attorney, Agent, or Firm*—Trop, Pruner & Hu, P.C.

(57) ABSTRACT

In one embodiment, the present invention includes a method to convert a pixel tuple in a red, green, blue (RGB) color space having R, G, and B color values into a human recognizable color name corresponding to a range of numerical values of a linear color palette scale based on application of the RGB color values to a predetermined set of hierarchical rules. Other embodiments are described and claimed.

15 Claims, 4 Drawing Sheets

CONVERTING COLOR DATA TO A COLOR PALETTE

BACKGROUND

Conversion of wavelengths of light, e.g., received by a digital camera, to values of a color spectrum such as a red, green, blue (RGB), is performed to enable display on a computer system. Known methods of converting RGB values to the colors of the visible light spectrum exist. However, in typical color conversions, many colors are missing in this spectrum. Missing colors include brown, tans, beige, white and grey, as these and other colors are produced by mixing various wavelengths of light.

Wavelength is brought up frequently in the discussion of color conversion because all colors arrive at a digital camera or other device as a wavelength or combination of wavelengths within the visible spectrum. Once the image arrives in the camera, the image is converted into one of several formats, all having a relationship to the 3-dimensional characteristics of the RGB model (e.g., hue, saturation, value (HSV), or hue, saturation, luminance (HSL)). While converting from visible light to RGB is quantifiable, once an image has been stored in this format there is no method of converting to a spectrum or other sort of palette, due to the subjectivity of how humans perceive colors.

While mathematical conversion models exist to translate RGB to a wavelength-based spectrum of colors, problems exist because the spectrum of visible light does not include the colors of grey, brown or tan because these colors are produced by mixing various wavelengths of light.

DETAILED DESCRIPTION

In various embodiments, a cognitive conversion of red, green, blue (RGB) values to a linear color palette may be used to convert RGB values (as typically found in digital image formats) to a color palette that is human recognizable.

The value of creating a method of translating RGB values from images to a known spectrum is that this provides for a computer system to be able to characterize pixels or ranges of pixels as human understandable colors. Such a system could be used to index photographs based on color (or shape, with additional analysis) or, inversely to allow a human to query the computer system for images that contain colors that are human describable.

To perform embodiments, RGB values, which are inherently represented as a 3-dimensional matrix, may be converted into a linear fashion that can be described as a color palette. The conversion that takes place does not convert RGB to wavelength (and luminosity) because the color spectrum does not contain pure wavelengths for composite colors such as brown, pink and magenta.

Figure 1:
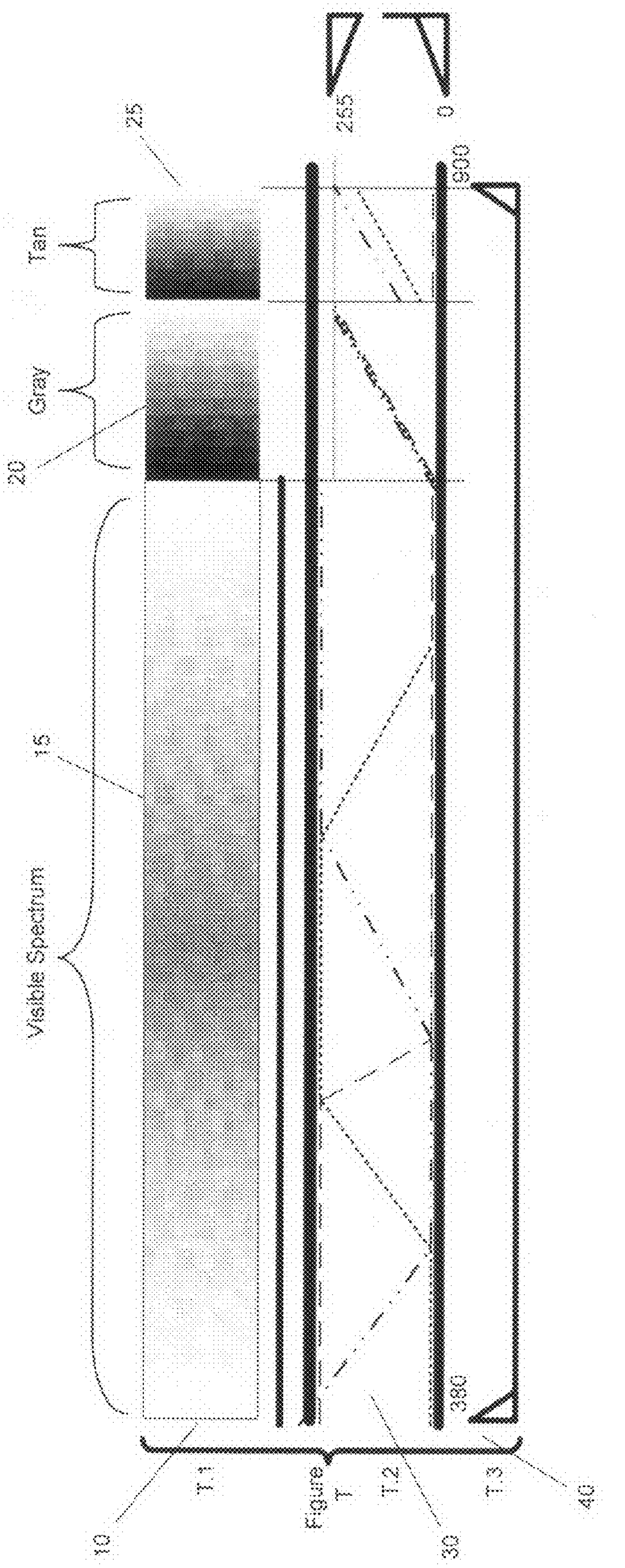
FIG. 1 is a representation of a linear color palette in accordance with one embodiment of the present invention.

The first step is to develop a color palette (or spectrum) that includes all of the colors (or at least a bulk of the colors) that are intended to be included in a given computer system. In one embodiment the color palette of FIG. 1 may include the colors that an exemplary system will be able to recognize. As shown in FIG. 1, spectrum or color palette 10 includes two sections 20 and 25 in addition to the visible light spectrum 15, thus including a greater range of colors. Waveform 30 shows the approximate RGB values associated with color palette 10, in which red is represented by the dotted and dashed line, green by the dotted line, and blue by the dashed line. The top value of waveform 30 is 255 and descends to 0 for each of the RGB values. A scale 40 describes a numerical scale of the associated color.

Next, we look at how RGB values behave over the various sections of the palette. In other words, in spectrum 15 the colors are produced by varying the values of R, G and B to mimic or relate to the visible light spectrum. In section 30, the colors black, white and varying shades of grey are produced through a parallel mixing of RGB values, shown in waveform 30. In section 25, the colors of brown, tan and beige are produced. In comparison to section 20, the "tan" spectrum contains red and green values that remain parallel, while the blue value remains at zero, as shown in waveform 30.

To make composite color palette 10 more helpful for computer systems to understand, numeric values may be assigned to the palette. The numbering system may be based on a modification of the visible light spectrum wavelength. Note in scale 40 a numbering scale is presented that describes colors from 380 to 900. Scale 40 is derived from the visible light spectrum in that numbers 380-700 may correspond to wavelengths of visible light from 380 nanometers (nm)-700 nm, while the additional range of numbers to 900 do not relate to the wavelength of the visible spectrum.

At this point, a color palette is provided. However, a mechanism by which to convert the RGB values of pixels to a known color may also be provided.

TABLE 1

| Color Name | Range |
|---|---|
| violet | 380-450 |
| blue | 450-495 |
| green | 495-570 |
| yellow | 570-590 |
| orange | 590-620 |
| red | 620-750 |
| black | 751-760 |
| grey | 761-830 |
| white | 831-840 |
| brown | 841-860 |
| tan or beige | 861-900 |

Table 1 provides a quantifiable method of translating palette ranges to a recognizable color in accordance with one embodiment of the present invention. Thus a computer can understand the human name for a color so that, if the system is utilized in such a manner as to have a user ask the computer to search for an image that has green or tan or orange colors in it, then the computer will be able to understand such colors.

Embodiments may further provide a method by which a sampled pixel's RGB values can be converted to a numeric value on the numbering scale of the aforementioned color palette. In one embodiment the calculation of RGB values to a color palette takes places using a range analysis model. The ultimate objective is to provide a model by which the computer can assign common, yet subjective, color names to various RGB values as well as a numeric scale to manage color ranges. As one example, RGB values of 150,150,150 are equal to grey, and in the relative color palette scale the color grey is equal to 770 as in Table 1 above. The conversion process from RGB to the color palette scale may involve performing an analysis of the relationship between the R, G and B values of the pixel. The analysis is based on a set of rules that are designed in a hierarchical manner, an embodiment of which is set forth in Table 2.

Next, it may be determined if the primary color is dark or light by performing additional calculations on the RGB values, using the following equations:

`if (@c[0]>125){$attribute_dark='yes';}` [EQ. 2]

`if (@c[0]<=125){$attribute_dark='no';}` [EQ. 3]

TABLE 2

| Color Name | Range | Rule | Dark | Light | Offset (+/−) |
|---|---|---|---|---|---|
| violet | 380-450 | R <= 4 × G & B = 2 × R & B > 160 | B < 160 | B >160 | 0.25 |
| blue | 450-495 | R < 50 & G < 200 & B > 125 &/or B > 2 × (R + G) | B < 125 | B > 125 | 0.25 |
| green | 495-570 | R < 50 & G > 125 & B < 50 or G > 2 × (B + G) | G < 125 | G > 125 | 0.25 |
| yellow | 570-590 | R\|\|G & B < (½ × R or G) & R or G > 130 | R + G < 130 | R + G > 130 | 0.15 |
| orange | 590-620 | R = 2 × G & G = 2 × B & R > 130 | R < 130 | R > 130 | 0.25 |
| red | 620-750 | R > 2 × (G + B) | R < 140 | R > 140 | 0.25 |
| black | 751-760 | R\|\|G\|\|B R <60 & | R < 30 | R > 60 | 0.1 |
| grey | 761-830 | R\|\|G\|\|B & R > 60 & R < 210 | R < 150 | R > 150 | 0.1 |
| white | 831-840 | R\|\|G\|\|B R > 220 | NA | NA | 0.1 |
| brown | 841-860 | (R − G) = ~75 & R < 200 & G < 200 & B < 50 | R < 150 | R > 150 | 0.25 |
| tan or beige | 861-900 | (R − G) = ~75 & R < 200 & G < 200 & B < 50 | R < 225 | R > 225 | 0.25 |

As another example, RGB values of 60,27,215 respectively are provided. These three colors may be converted to a value on the color palette scale as follows. First, the system looks for the top value, referred to herein as the major color. This happens to be 215 on the blue scale. The system then looks at the relationship of the minor colors (R and G) to the major color. The following equation may be used in one embodiment to determine if the major color falls into the primary color range.

`$d=(@c[1]+@c[2])/@c[0]` [EQ. 1]

where c[1] and c[2] are the minor colors and c[0] is the major color. The result, $d, is a ratio between the major color and the sum of the minor colors. If this value ($d) is less than or equal to a threshold (e.g., 0.5), then the original color is determined to be a primary color, in one embodiment. In this case, the primary color is B (blue). Otherwise, the original color is determined to be a composite. In either case, a conversion may be performed to convert the RGB values into a given color name or range (either a primary or non-primary) according to a predetermined set of rules. Rules in accordance with one embodiment of the present invention are shown in Table 2, above and may be based on relationships between the color values.

where the value of 125 is the approximate halfway point of available RGB values (limit of 255).

In this example, the primary color (B=215) is greater than 125, so an attribute of "dark" is assigned to the color. Note that attributes may be optional values when performing image analysis. In other words, just because the system identifies a color as having an attribute of dark does not preclude the system from ignoring the usage of the attribute. However, and inversely, if a user requests a search for "dark+color" then the system may weigh those values heavier.

Table 3 below shows an output of a program in accordance with one embodiment of the present invention:

TABLE 3

```
Value: r = 60
Value: b = 215
Value: g = 27
Top value = 215
Value: r = 60
Value: b = 215
Top color = b
Value: g = 27
d 0.404651162790698
Primary color is: b
c0 215
Attribute dark: yes
```

From the above program output, the system has identified the RGB values of (60,27,215) as "b" (blue) with the attribute of "dark". In some embodiments, a reference table can provide for analogous color descriptions, e.g., royal blue instead of blue. Additionally, the system is not limited to the colors provided in the tables and examples described herein, and a system can be extended to include as many ranges and color analogies as desired.

Using embodiments of the present invention to translate RGB values from images to a known spectrum enables a computer system to be able to characterize pixels or ranges of pixels as human understandable colors. Such a system could be used to index photos based on color (or shape with additional analysis) or, inversely, to allow a human to query the computer system for images that contain colors that are human describable.

Figure 2:
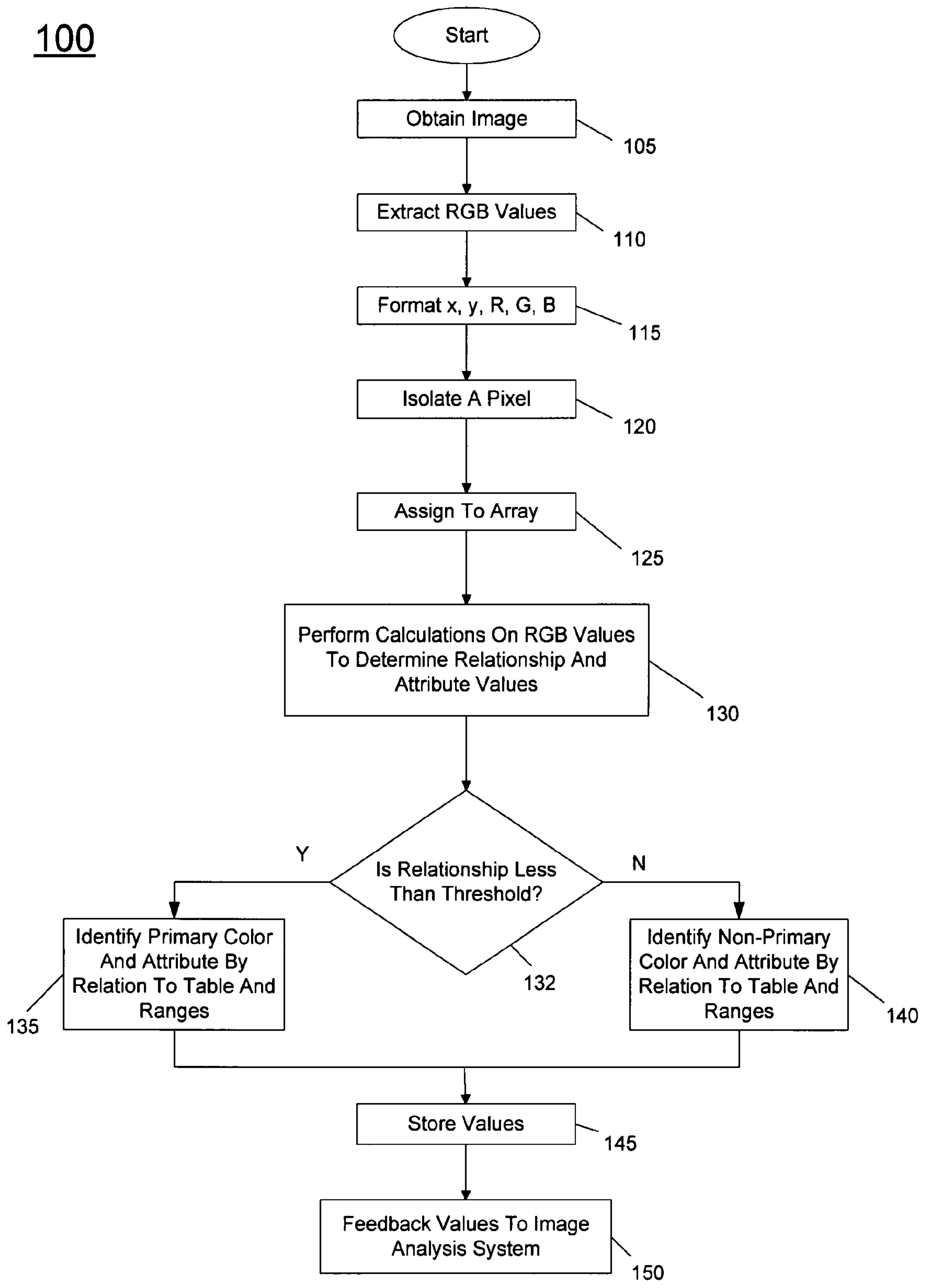
FIG. 2 is a flow diagram of a method in accordance with one embodiment of the present invention.

Referring now to FIG. 2, shown is a flow diagram of a method in accordance with one embodiment of the present invention. As shown in FIG. 2, method 100 may be used to convert RGB values of a pixel into a human understandable color of a color palette available in a given computer system. As shown in FIG. 2, method 100 may begin by obtaining an image (block 105). For example, in various implementations a digital image may be received, e.g., from an input device such as a digital camera or so forth, received as an attachment to an email or in another such manner. From this digital image, RGB values may be extracted (block 110). For example, for each pixel of the digital image RGB values may be extracted and formatted into a file with an associated value of its location within the image, e.g., x, y coordinate information (block 115). Then, from this file a given pixel may be isolated (block 120) and the RGB values may be assigned to an array (block 125). For example, in one embodiment the highest color value may be applied to a first variable C0, the next lowest color value to C1, and the next lowest color value to C2, although the scope of the present invention is not limited in this regard. Then, various calculations may be performed on the RGB values to obtain a relationship between the values (which may correspond to a ratio, in some embodiments) and attribute values (block 130). For example, calculations such as described above with regard to Equations 1-3 may be performed to obtain a ratio and attribute values. Next it may be determined at diamond 132 if the relationship is less than or equal to a predetermined threshold. Note that in some embodiments, the steps of blocks 125, 130, and diamond 132 may be optional. Based on the ratio, the pixel may be associated with a primary color (or not) and control passes to block 135 to identify the primary color and its attribute. For example, the RGB values may be applied to a rule table such as that of Table 2 to determine the color name on the color palette scale and the attribute associated with the value (e.g., light or dark). Alternately, if the relationship is greater than the predetermined threshold, control passes to block 140, where the pixel may be identified as a non-primary color, with a similar color name and attribute analysis performed.

Then, control passes to block 145, where the values determined may be stored. Such values may be stored in the data file itself including the image data, or it may be stored in a separate file, or both. This information may also be provided as feedback to an image analysis system (block 150). For example, such a system may be used in connection with searching, e.g., of information in a desktop or via the Internet using a search engine or another such manner. In such methods, a user query for an image including a particular color may be received. Of course, this user-generated query will be for a human recognizable color name. Accordingly, the mapping may be present in the search engine to map this color name to the range of colors, such as that set forth in Table 1 of the color palette available for the system. While shown with this particular implementation in the embodiment of FIG. 2, the scope of the present invention is not limited in this regard.

Figure 3:
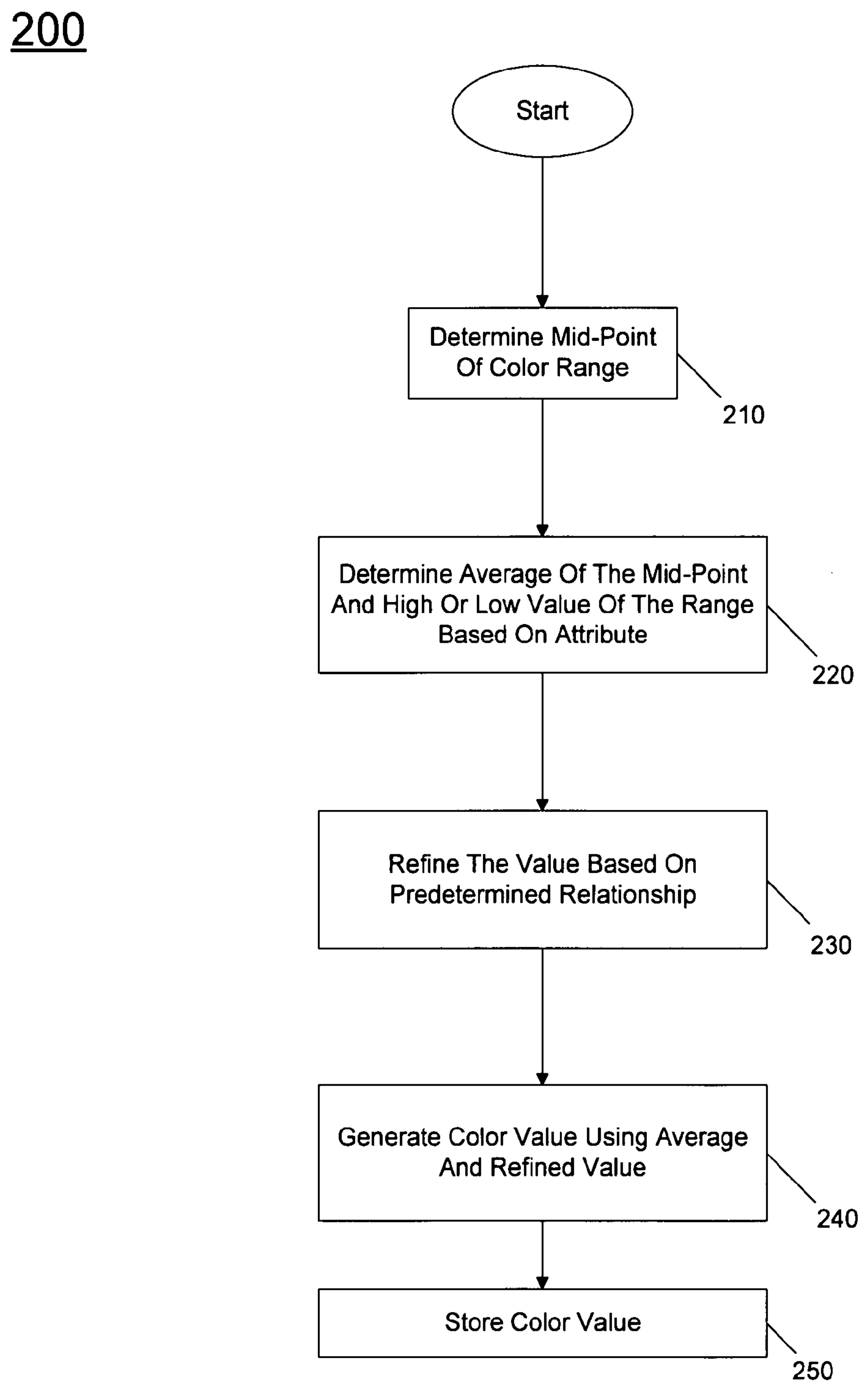
FIG. 3 is a flow diagram of a method of determining a numerical value in accordance with one embodiment of the present invention.

In some embodiments, in addition to determining a range for a given pixel, i.e., a color range corresponding to a human understandable color name, certain embodiments may also determine a numerical value within the range, based on the pixel information. Referring now to FIG. 3, shown is a flow diagram of a method of determining a numerical value in accordance with one embodiment of the present invention. As shown in FIG. 3, method 200 may begin by determining a mid-point of the color range (block 210). For example, assume the determined color for a given pixel is blue, the mid-point of the range may correspond to 472.5. Next, an average of this mid-point and the high or low value of the range may be determined based on the corresponding attribute for the pixel (block 220). For example, assume a light attribute for the pixel in this instance, the average may be based on the mid-point and the high value of the range to obtain a value of 483.75. Next, this value may be refined based on a predetermined relationship (block 230). While the scope of the present invention is not limited in this regard, in one embodiment, this predetermined relation may correspond to the following equation:

$$(R+G)\div B\div 100 \quad \text{[EQ. 4]}$$

Assuming the pixel has pixel values of 60 for red, 27 for green and 215 for blue, this refined value may correspond to 1.95. Then, still referring to FIG. 3, the color value may be generated using the average and the refined value, and then stored (blocks 240 and 250). In this example, this value may correspond to 486. While not shown in the embodiment of FIG. 3, understand that this determined numerical value may also be stored with the additional information corresponding to the pixel, e.g., the color name and attribute. While shown with this particular implementation in the embodiment of FIG. 3, understand the scope of the present invention is not limited in this regard and different calculations may be performed to determine a numerical value for a given pixel for each color range.

Figure 4:
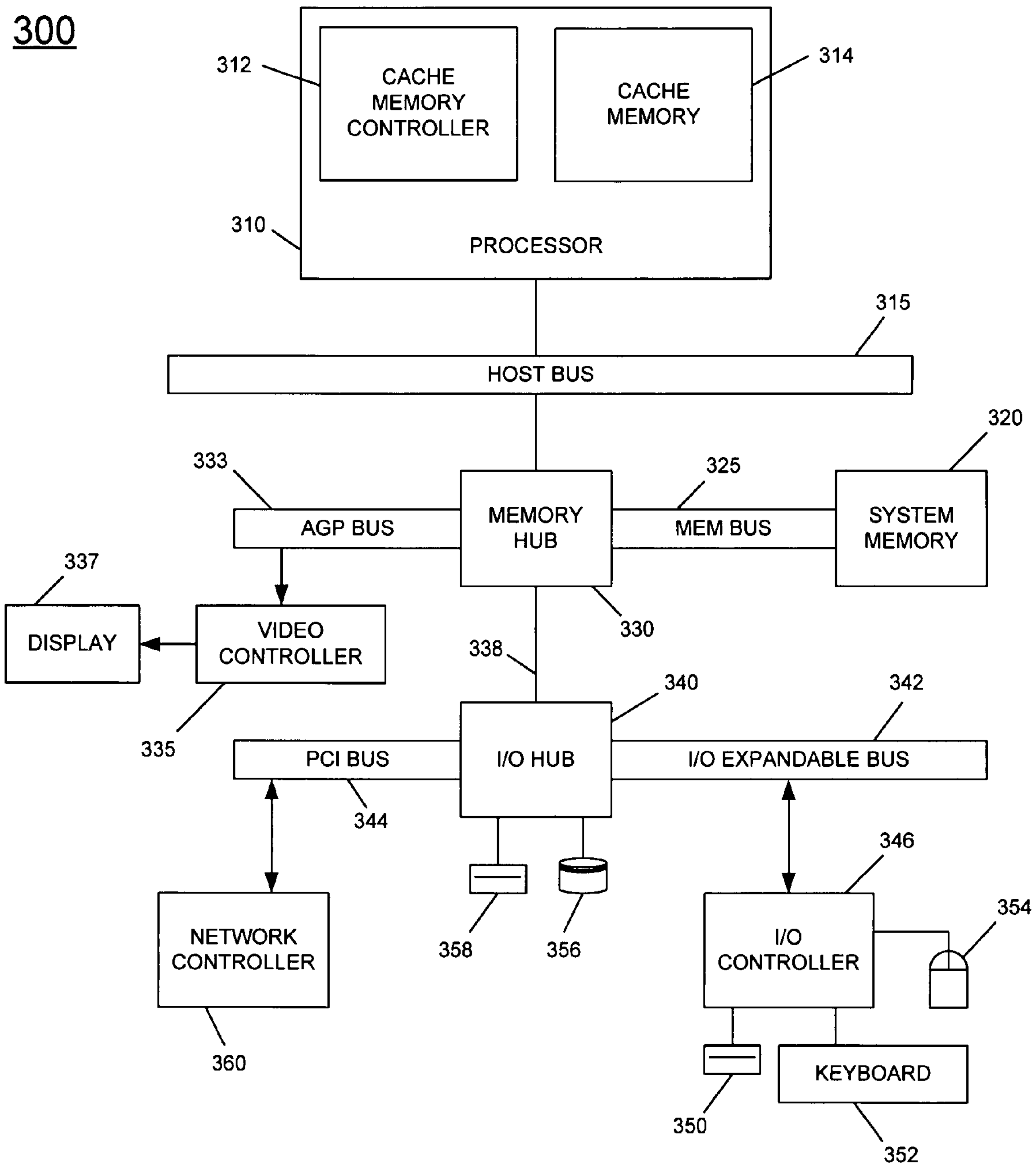
FIG. 4 is a block diagram of a computer system in accordance with one embodiment of the present invention.

Embodiments may be used in various systems. FIG. 4 is a block diagram of a computer system 300 in which embodiments of the invention may be used. As used herein, the term "computer system" may refer to any type of processor-based system, such as a notebook computer, a server computer, a laptop computer, or the like.

Now referring to FIG. 4, in one embodiment, computer system 300 includes a processor 310, which may include a general-purpose or special-purpose processor such as a microprocessor, microcontroller, a programmable gate array (PGA), and the like. Processor 310 may include a cache memory controller 312 and a cache memory 314. Processor 310 may be coupled over a host bus 315 to a memory hub 330 in one embodiment, which may be coupled to a system memory 320 (e.g., a dynamic RAM) via a memory bus 325. Memory hub 330 may also be coupled over an Advanced Graphics Port (AGP) bus 333 to a video controller 335, which may be coupled to a display 337.

Memory hub 330 may also be coupled (via a hub link 338) to an input/output (I/O) hub 340 that is coupled to an input/output (I/O) expansion bus 342 and a Peripheral Component Interconnect (PCI) bus 344, as defined by the PCI Local Bus Specification, Production Version, Revision 2.1 dated June 1995. In one embodiment, system memory 320 may include a program to perform embodiments of the present invention, as well as one or more databases to enable storage and retrieval of image data using human understandable color names.

I/O expansion bus 342 may be coupled to an I/O controller 346 that controls access to one or more I/O devices. As shown in FIG. 4, these devices may include in one embodiment storage devices, such as a floppy disk drive 350 and input devices, such as a keyboard 352 and a mouse 354. I/O hub 340 may also be coupled to, for example, a hard disk drive 358 and a compact disc (CD) drive 356, as shown in FIG. 4. It is to be understood that other storage media may also be included in the system.

PCI bus 344 may also be coupled to various components including, for example, a network controller 360 that is coupled to a network port (not shown). Additional devices may be coupled to the I/O expansion bus 342 and the PCI bus 344. Although the description makes reference to specific components of system 300, it is contemplated that numerous modifications and variations of the described and illustrated embodiments may be possible.

Embodiments may be implemented in code and may be stored on a storage medium having stored thereon instructions which can be used to program a system to perform the instructions. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

receiving, in a processor of a computer system, a pixel tuple of a digital image in a primary color space;

designating the one of a first, second or third color value of the pixel having the highest value as a major color and designating the remaining two color values as minor colors;

determining a ratio between a value of the major color and a sum of the values of the minor colors, and setting the pixel as a primary color if the ratio is less than or equal to a first threshold, otherwise setting the pixel as a non-primary color; and converting the pixel tuple into a value of a color palette scale, the color palette scale including a primary range for a visible light spectrum, a secondary range for a first composite spectrum corresponding to parallel values for the first, second and third color values, and a tertiary range for a second composite spectrum corresponding to parallel values for the first and second color values.

2. The method of claim 1, further comprising determining an attribute of the pixel by analyzing the value of the major color with respect to an attribute rule for the color palette scale value.

3. The method of claim 2, wherein the attribute is an indication of whether the pixel is light or dark.

4. The method of claim 3, further comprising storing the color palette scale value and the attribute associated with the pixel in a database of a system memory of the computer system.

5. The method of claim 4, wherein the color palette scale value corresponds to a human recognizable color name.

6. The method of claim 5, further comprising receiving a search request for an image stored in the database having the human recognizable color name, searching the database for an image including a color palette scale value that corresponds to the human recognizable color name, and outputting the image to a display.

7. The method of claim 2, wherein converting the pixel tuple comprises applying the pixel tuple to a predetermined set of rules to identify the color palette scale value, based on the first, second and third color values.

8. The method of claim 7, further comprising determining a numerical value within a range of the color palette scale value based on the first, second and third color values, the attribute, and high and low values for the color palette scale value range.

9. An article comprising a non-transitory computer-readable storage medium including instructions that when executed enable a computer system to:

receive a pixel tuple of a pixel of a digital image in a red, green, blue (RGB) color space having R, G, and B color values; and convert the pixel tuple into a human recognizable color name corresponding to a range of numerical values of a linear color palette scale based on application of the RGB color values to a predetermined set of hierarchical rules, the linear color palette scale including a primary range for a visible light spectrum, a secondary range for a gray scale spectrum corresponding to parallel values for the RGB color values, and a tertiary range for a tan scale spectrum corresponding to parallel values for the R and G color values.

10. The article of claim 9, further comprising instructions that when executed enable the computer system to determine a ratio between a value of a first one of the RGB color values and a sum of the values of the remaining two RGB color values, and set the pixel as a primary color if the ratio is less than or equal to a first threshold, otherwise set the pixel as a non-primary color.

11. The article of claim 10, further comprising instructions that when executed enable the computer system to determine an attribute of the pixel by analyzing the value of the first one of the RGB color values with respect to an attribute rule for the range of numerical values.

12. A system comprising:

a processor;

a dynamic random access memory (DRAM) coupled to the processor including instructions that when executed enable the system to receive a pixel tuple of a pixel of a digital image in a red, green, blue (RGB) color space having R, G, and B color values, and convert the pixel tuple into a human recognizable color name corresponding to a range of numerical values of a linear color palette scale based on a relationship of the RGB color values as set forth by a predetermined set of hierarchical rules, the linear color palette scale including a primary range for a visible light spectrum, a secondary range for a gray scale spectrum corresponding to parallel values for the RGB color values, and a tertiary range for a tan scale spectrum corresponding to parallel values for the R and G color values.

13. The system of claim 12, wherein the DRAM includes instructions that when executed enable the system to determine a numerical value within the range of numerical values based on a predetermined rule set for the range of numerical values, wherein each of the range of numerical values within the linear color palette scale has a different predetermined rule set.

14. The system of claim 13, wherein the DRAM includes instructions that when executed enable the system to store the human recognizable color name, the numerical value and the attribute associated with the pixel in a database.

15. The system of claim 14, wherein the DRAM includes instructions that when executed enable the system to receive a search request for an image having the human recognizable color name, search the database for an image including the human recognizable color name, and output the image to a display.

* * * * *